(12) United States Patent
Wilson et al.

(10) Patent No.: US 8,058,091 B2
(45) Date of Patent: Nov. 15, 2011

(54) FRONT LIT PIN/NIP DIODE HAVING A CONTINUOUS ANODE/CATHODE

(75) Inventors: Robin Wilson, Belfast (GB); Conor Brogan, Belfast (GB); Hugh J. Griffin, Newtownabbey (GB); Cormac MacNamara, Belfast (GB)

(73) Assignee: Icemos Technology Ltd., Belfast, Northern Ireland (GB)

( * ) Notice: Subject to any disclaimer, the term of this patent is extended or adjusted under 35 U.S.C. 154(b) by 788 days.

(21) Appl. No.: 12/175,586

(22) Filed: Jul. 18, 2008

(65) Prior Publication Data

US 2008/0299698 A1    Dec. 4, 2008

Related U.S. Application Data

(62) Division of application No. 11/554,437, filed on Oct. 30, 2006, now Pat. No. 7,560,791.

(60) Provisional application No. 60/731,171, filed on Oct. 28, 2005.

(51) Int. Cl.
*H01L 31/00* (2006.01)

(52) U.S. Cl. .......... 438/57; 438/510; 438/429; 438/433; 438/451; 257/458; 257/459; 257/E21.111

(58) Field of Classification Search .................... 438/57, 438/510, 80, 81, 429, 433, 451; 257/186, 257/E21.111, E31.001, 458, 459
See application file for complete search history.

(56) References Cited

U.S. PATENT DOCUMENTS

| 3,648,131 | A | 3/1972 | Stuby |
| 5,998,292 | A | 12/1999 | Black et al. |
| 6,087,719 | A | 7/2000 | Tsunashima |
| 6,175,141 | B1 | 1/2001 | Hofbauer et al. |
| 6,426,991 | B1 | 7/2002 | Mattson et al. |
| 6,762,473 | B1 * | 7/2004 | Goushcha et al. ............ 257/443 |
| 6,831,367 | B2 | 12/2004 | Sekine |
| 7,144,751 | B2 | 12/2006 | Gee et al. |
| 2006/0027934 | A1 | 2/2006 | Edelstein et al. |
| 2008/0067622 | A1 | 3/2008 | Bui et al. |

FOREIGN PATENT DOCUMENTS

| WO | 2005001941 A2 | 1/2005 |
| WO | 2005031880 A1 | 4/2005 |

* cited by examiner

*Primary Examiner* — Thinh T Nguyen
(74) *Attorney, Agent, or Firm* — Panitch Schwarze Belisario & Nadel LLP

(57) ABSTRACT

A photodetector includes a semiconductor substrate having first and second main surfaces opposite to each other. The photodetector includes at least one trench formed in the first main surface and a first anode/cathode region having a first conductivity formed proximate the first main surface and sidewalls of the at least one trench. The photodetector includes a second anode/cathode region proximate the second main surface. The second anode/cathode region has a second conductivity opposite the first conductivity. The at least one trench extends to the second main surface of the semiconductor substrate.

10 Claims, 2 Drawing Sheets

FRONT LIT PIN/NIP DIODE HAVING A CONTINUOUS ANODE/CATHODE

CROSS-REFERENCE TO RELATED APPLICATIONS

This application is a divisional application of U.S. patent application Ser. No. 11/554,437, filed Oct. 30, 2006 now U.S. Pat. No. 7,560,791, entitled, "Front Lit PIN/NIP Diode Having a Continuous Anode/Cathode," currently. This application claims the benefit of U.S. Provisional Patent Application No. 60/731,171, filed Oct. 28, 2005, entitled, "Front Lit PIN/NIP Diode Having a Continuous Anode/Cathode."

BACKGROUND OF THE INVENTION

Embodiments of the present invention relate to a photodetector, and more particularly, to a photodetector array using positive-intrinsic-negative (PIN)/negative-intrinsic-positive (NIP) diodes having a continuous anode/cathode from front side to back side.

A photon detector or photodetector converts radiant power directly into electrical current; also called a photodiode. PIN/NIP diodes or PIN/NIP photodiodes are generally known in the art. A PIN/NIP diode is a form of photodetector.

A PIN diode is a type of photodiode with a large, neutrally doped intrinsic region sandwiched between p-doped and n-doped semiconducting regions. The PIN diode's name comes from the layering of these materials positive, intrinsic, negative (PIN). Broadly speaking, a photodiode is a semiconductor device that converts light to electrical current. A PIN diode typically exhibits an increase in its electrical conductivity as a function of the intensity, wavelength, and modulation rate of the incident radiation.

A PIN diode is also a semiconductor device that operates as a variable resistor at radiofrequency (RF) and microwave frequencies. The resistance value of the PIN diode is determined only by the forward biased direct current (DC) current. At high RF frequencies when a PIN diode is at zero or reverse bias, it appears as a parallel plate capacitor, essentially independent of reverse voltage.

Photoconductor arrays are groups of a plurality of photodetectors, such as PIN/NIP diodes, arranged together on a substrate or wafer.

It is desirable to provide a photodetector array using PIN/NIP diodes having a continuous anode/cathode from front side to back side.

BRIEF SUMMARY OF THE INVENTION

Briefly stated, embodiments of the present invention comprise a photodetector that includes a semiconductor substrate having first and second main surfaces opposite to each other. The photodetector includes at least one trench formed in the first main surface and a first anode/cathode region having a first conductivity formed proximate the first main surface and sidewalls of the at least one trench. The photodetector includes a second anode/cathode region proximate the second main surface. The second anode/cathode region has a second conductivity opposite the first conductivity. The at least one trench extends to the second main surface of the semiconductor substrate.

Embodiments of the present invention further comprise a method of manufacturing a photodetector including providing a semiconductor substrate having first and second main surfaces opposite to each other. At least one trench is formed in the first main surface through to the second main surface. The first main surface and sidewalls of the trench are doped with a dopant of a first conductivity. The at least one trench extends through the semiconductor layer and to a first depth position in the semiconductor substrate. The second main surface is doped with a dopant of a second conductivity opposite to the first conductivity.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
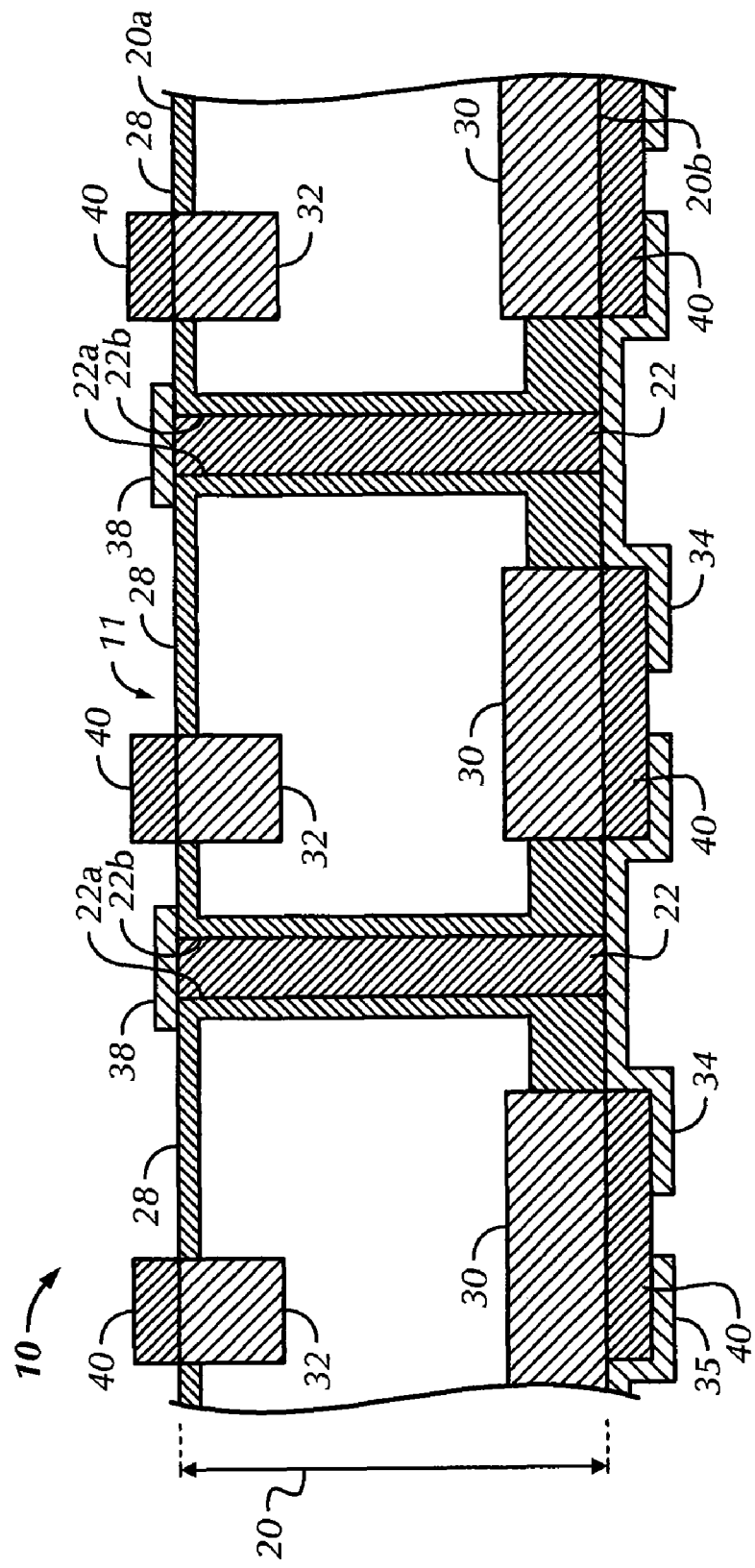
FIG. 1 is a partial cross-sectional elevational view of a photodetector array using positive-intrinsic-negative (PIN)/negative-intrinsic-positive (NIP) diodes having a continuous anode/cathode from front side to back side with a first preferred embodiment of the present invention.

Certain terminology is used in the following description for convenience only and is not limiting. The words "right", "left", "lower", and "upper" designate directions in the drawings to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a" as used in the claims and in the corresponding portion of the specification, means "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, the reference to n or p can also mean that either n and p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Referring to the drawings in detail, wherein like numerals reference indicate like elements throughout, there is shown in FIG. 1 a photodetector array, generally designated 10, in accordance with a preferred embodiment of the present invention.

The photodetector array 10 includes a plurality of photodetector cells or photodetectors 11. The photodetector array 10 includes a semiconductor substrate 20 having first and second main surfaces 20a and 20b opposite to each other. A plurality of trenches 22 are formed in the first main surface 20a. The trenches 22 extend to the second main surface 20b of the semiconductor substrate 20. The photodetector 11 includes a first anode/cathode region 28 having a first conductivity formed proximate the first main surface 20a and sidewalls 22a, 22b of the at least one trench 22, and a second anode/cathode region 30 proximate the second main surface 20b, and the second anode/cathode region 30 has a second conductivity opposite the first conductivity. The semiconductor substrate 20 has a first doping concentration of the second conductivity. The photodetector 11 also includes a doped isolation region 32 formed in the first main surface 20a and extending through the first anode/cathode region 28. The doped isolation region 32 has a second doping concentration different than the first doping concentration. The first anode/cathode region 28 is continuous from the first main surface 20a, along the sidewalls 22a, 22b of the trench 22 to the second main surface 20b. Thus, the first anode/cathode region 28 is a through-wafer structure providing continuity to the back surface 20b.

The trenches 22 may be filled with a conductive material such as doped or undoped polysilicon, a metal or a metal silicide, but they need not be.

It may be desirable to partially fill the trenches 22 proximate to the second main surface 20b for processing.

Figure 2:
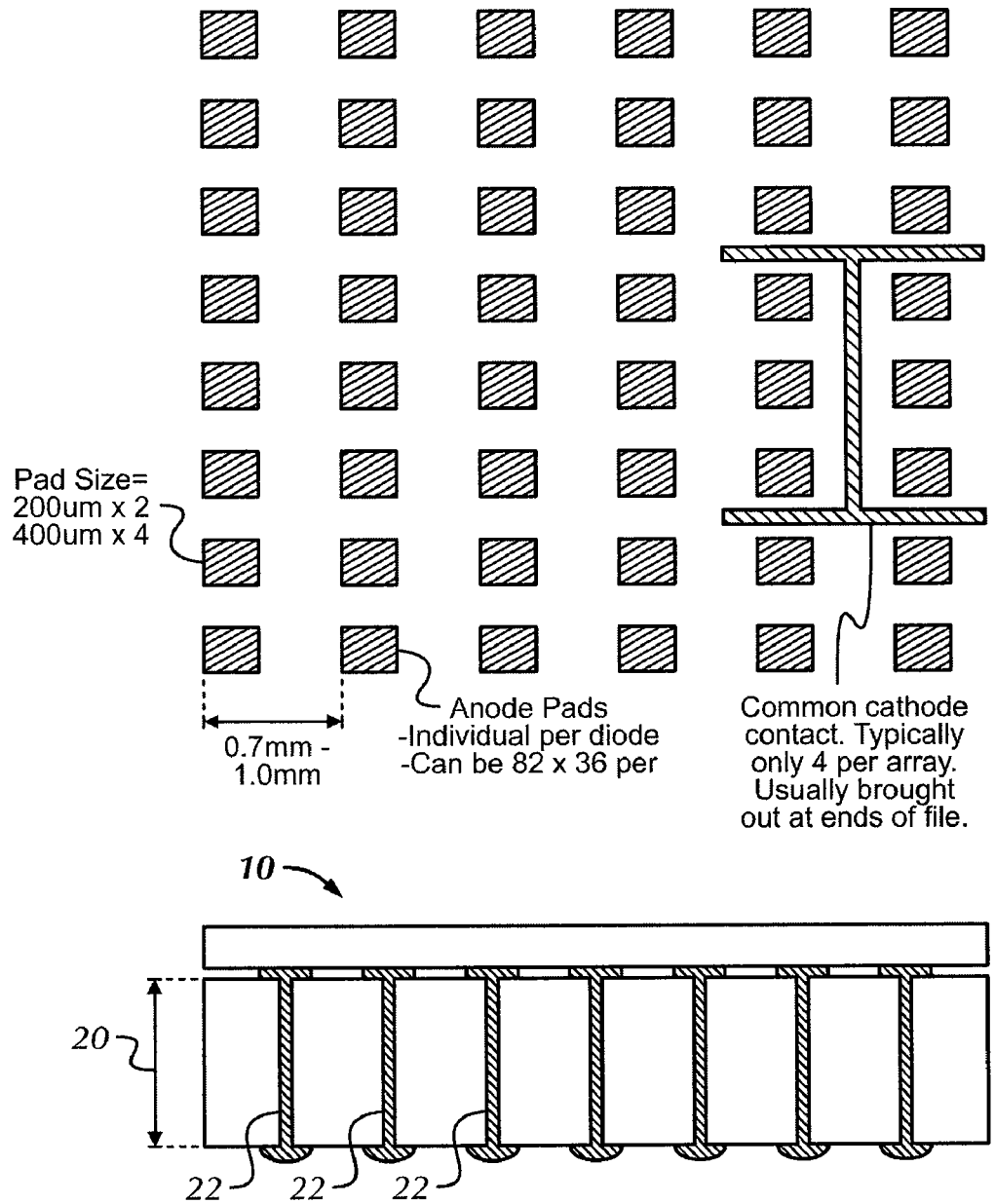
FIG. 2 is a top plan view of the photodetector array of FIG. 1.

FIG. 2 is a top plan view of the photodetector array 10 showing that the at least one trench 22 is a relatively small area in the first anode/cathode region 28. By not filling the trenches 22, the sidewalls 22a, 22b of the trenches 22 can also function as part of the first anode/cathode region 28 thereby increasing the area lost by the trench 22 itself.

The photodetector array 10 also includes a backside contact 34 formed on the first anode/cathode layer 28 proximate the second main surface 20b and a backside contact 35 formed on the second anode/cathode layer 30 proximate the second main surface 20b.

It should be noted that the first conductivity can be one of p-type and n-type and the second conductivity can be the other one of p-type and n-type without departing from the invention. The photodetectors in the array may be, for example, positive-intrinsic-negative (PIN) diodes or negative-intrinsic-positive (NIP) diodes without departing from the invention.

Preferably, the semiconductor substrate 20 is formed of silicon (Si). But, the semiconductor substrate 20 may be formed of other materials such as gallium arsenide (GaAs), germanium (Ge) or the like.

Generally, if a semiconductor crystal contains no impurities, the only charge carriers present are those produced by thermal breakdown of the covalent bonds and the conducting properties are characteristic of the pure semiconductor material. Such a crystal is termed an "intrinsic" semiconductor. When used with reference to a PIN or NIP diode, conventional usage in the art includes lightly doped intrinsic areas. While used herein to refer to the semiconductor substrate 20 or substrate/epitaxial layer as "intrinsic", embodiments of the present invention recognize that the photodetector array 10 in accordance with embodiments of the present invention will work comparably with undoped substrates even when the semiconductor substrate 20 has been lightly doped or even more heavily doped. Accordingly, the term "intrinsic" should not be construed as limiting and embodiments of the present invention can embrace pure and doped semiconductor substrates formed of various materials.

The photodetector array 10 may also include a passivation material 40 on either or both of the first and second main surfaces 20a, 20b such as an oxide, a nitride, a glass, polysilicon and combinations thereof.

Preferably, the photodetector array 10 includes a plurality of isolation diffusion regions 32 formed in the first main surface 20a and a plurality of adjacent first anode/cathode regions 28 defined by the isolation diffusion regions 32. The plurality of first anode/cathode regions 28 may be associated with pixels when the photodetector array 10 is used in an imaging application such as X-ray or computed tomography (CT) imaging. Typically, the photodetector cells 11 are on the order of 1 millimeter (mm) by 1 mm. The trenches 22 are about 15-20 microns (μm) in diameter or 15-20 μm across for non-circular trenches.

A method of manufacturing a photodetector includes providing a semiconductor substrate 20 having first and second main surfaces 20a, 20b opposite to each other. At least one trench 22 is formed in the first main surface 20a through to the second main surface 20b. The first main surface 20a is selectively masked with a first mask (not shown). The first main surface 20a and sidewalls 22a, 22b of the trench 22 are doped with a dopant of a first conductivity. The second main surface 20b is selectively masked with a second mask (not shown) and doped with a dopant of a second conductivity opposite to the first conductivity. The method also includes removing the first mask from the first main surface 20a, selectively masking the first main surface 20a with a third mask (not shown) and doping with a third dopant of the second conductivity the first main surface 20a of the semiconductor layer 20 to form an isolation region 32.

The surfaces 20a, 20b of the semiconductor substrate 20 and/or the semiconductor layer may be smoothed, if needed, using one or more of the following process steps:
(i) an isotropic plasma etch may be used to remove a thin layer of silicon (typically 100-1000 Angstroms (Å)) from the trench surfaces.
(ii) a sacrificial silicon dioxide layer may be grown on the surfaces of the trench and then removed using an etch such as a buffered oxide etch or a diluted hydrofluoric (HF) acid etch.

The use of either or both of these techniques can produce smooth trench surfaces with rounded corners while removing residual stress and unwanted contaminates. However, where it is desirable to have vertical sidewalls and square corners, an anisotropic etch process will be used instead of the isotropic etch process discussed above. Anisotropic etching, in contrast to isotropic etching, generally means different etch rates in different directions in the material being etched.

The doping is performed by one of ion implantation, solid diffusion, liquid diffusion, spin-on deposits, plasma doping, vapor phase doping, laser doping or the like. Doping with boron B results in a more p-type region, doping with phosphorus results in a more n-type region and doping with arsenic Ar results in a more n-type region. Other dopants may be utilized such as antimony Sb, bismuth Bi, aluminum Al, indium In, gallium Ga or the like depending on the material of the substrate and the desired strength of the doping.

Preferably, the first and second dopants are applied by diffusion. The semiconductor substrate is placed in a suitable diffusion chamber at about 700° C. to about 1200° C. proximate to a solid source such as boron or phosphorous. Alternatively, the semiconductor substrate can be exposed to a liquid source of dopant at about 700° C. to about 1200° C.

Alternatively, the first dopant may be implanted. The first anode/cathode region 28 is implanted by boron B, phosphorus P, arsenic As or the like, at a high energy level in the range of about 40 to 1000 kilo-electronvolts (KeV). Preferably, the energy level is in the range of about 200 to 1000 KeV, but it should be recognized that the energy level should be selected to sufficiently implant the dopant. The second dopant may be by boron B, phosphorus P, arsenic Ar or the like. The second anode/cathode region 30 is the second conductivity. Another drive in step at a temperature of up to 1200° Celsius may be performed for up to 12 hours so that implanted dopant is sufficiently driven into the substrate 20.

A passivation material 40 may be applied to either the first or second main surfaces using one of thermal growth, low pressure (LP) chemical vapor deposition (CVD), plasma enhanced chemical vapor deposition (PECVD), Atmospheric pressure chemical vapor deposition (APCVD), spun-on-glass (SOG), glass frit, deposition, direct application and combinations thereof. The passivation material 40 is one of an oxide, a nitride, a glass and polysilicon. While not required, the passivation materials 40 improve the performance of the resulting photodetector array 10.

Backside contacts 34, 35 are formed by sputtering, evaporation and/or electroplating on the first anode/cathode region 28 and the second anode/cathode region 30 respectively, and a peripheral contact 38 is similarly formed on the first anode/cathode region 28 proximate the first main surface 20a, resulting in the photodetector array 10 shown in FIG. 1. The contacts 34, 35, 38 may be a metal such as aluminum Al, aluminum silicon Al[% Si], copper Cu, gold Au, silver Ag, titanium Ti, tungsten W, nickel Ni or the like and combinations thereof or may be doped or undoped polysilicon. The contacts 34, 35, 38 may also be layers of differing metals.

Other processing steps, as is known in the art, may be utilized without departing from the invention. For example, the trenches 22 may be etched using plasma etching, Reactive Ion Etching (RIE) or chemical etching. The trenches 22 may be smoothed, if needed, using processing steps such as isotropic plasma etch or deep ion etching such as deep RIE. Portions of the silicon substrate 20 or the entire device may have a sacrificial silicon dioxide layer grown thereon and then may be etched using a buffered oxide etch or a diluted hydrofluoric (HF) acid etch or the like to produce smooth surfaces and/or rounded corners thereby reducing residual stress and unwanted contaminants. Furthermore, additional layers in addition to the passivation layer(s) 40 may be added as desired. Furthermore, the conductive semiconductor substrate 20 can be doped, implanted and/or diffused to achieve a particular conductivity.

Another method of manufacturing a photodetector array 10 in accordance with a second preferred embodiment of the present invention includes providing a semiconductor substrate 20 having first and second main surfaces 20a and 20b opposite to each other. The semiconductor substrate 20 is of a first conductivity. An epitaxial layer (not shown) of the first conductivity is deposited or grown on the first main surface 20a of the semiconductor substrate 20. The epitaxial growth or deposition may occur in a suitable reaction chamber at a temperature of up to about 1200° C. All of the other processing steps are then performed to form the photodetector array 10.

From the foregoing, it can be seen that the present invention is directed to a photodetector diode using isolation diffusions and methods for manufacturing a photodetector diode using isolation diffusions. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method of manufacturing a photodetector comprising:
    providing a semiconductor substrate having first and second main surfaces opposite to each other;
    forming at least one trench in the first main surface of the semiconductor substrate, the at least one trench extending through the semiconductor substrate and to the second main surface of the semiconductor substrate;
    selectively masking the first main surface with a first mask;
    doping the first main surface and sidewalls of the at least one trench with a first dopant of a first conductivity to form a first anode/cathode region;
    selectively masking the second main surface with a second mask;
    doping the second main surface with a second dopant of a second conductivity opposite to the first conductivity to form a second anode/cathode region;
    selectively masking the first main surface with a third mask; and
    doping the first main surface with a third dopant of the second conductivity to form an isolation region.

2. The method according to claim 1, further comprising:
    removing the first mask from the first main surface.

3. The method according to claim 2, further comprising:
    removing the third mask from the first main surface.

4. The method according to claim 3, further comprising:
    filling the at least one trench with one of doped polysilicon, undoped polysilicon, metal and metal silicide.

5. The method according to claim 4, further comprising:
    applying a passivation material using one of thermal growth, low pressure (LP) chemical vapor deposition (CVD), plasma enhanced chemical vapor deposition (PECVD), Atmospheric pressure chemical vapor deposition (APCVD), spun-on-glass (SOG), glass frit, deposition, direct application and combinations thereof.

6. The method according to claim 5 wherein the passivation material is one of an oxide, a nitride, a glass, polysilicon and combinations thereof.

7. The method according to claim 1, further comprising:
    at least one of planarizing, grinding and polishing the second main surface of the semiconductor substrate; and
    forming a second passivation layer on the second main surface of the semiconductor substrate.

8. The method according to claim 1, wherein the first anode/cathode region is heavily doped p-type and the second anode/cathode region is heavily doped n-type.

9. The method according to claim 1, wherein the at least one trench is formed utilizing one of plasma etching, Reactive Ion Etching (RIE) and chemical etching.

10. The method according to claim 8, wherein the doping is performed by one of ion implantation, solid diffusion, liquid diffusion, spin-on deposits, plasma doping, vapor phase doping and laser doping.

* * * * *